United States Patent
Tseng et al.

(10) Patent No.: US 9,646,923 B2
(45) Date of Patent: May 9, 2017

(54) SEMICONDUCTOR DEVICES, METHODS OF MANUFACTURE THEREOF, AND PACKAGED SEMICONDUCTOR DEVICES

(71) Applicant: Taiwan Semiconductor Manufacturing Company, Ltd., Hsin-Chu (TW)

(72) Inventors: Yu-Jen Tseng, Hsin-Chu (TW); Yen-Liang Lin, Taichung (TW); Tin-Hao Kuo, Hsin-Chu (TW); Chen-Shien Chen, Zhubei (TW); Mirng-Ji Lii, Sinpu Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/719,019

(22) Filed: Dec. 18, 2012

(65) Prior Publication Data

US 2014/0167253 A1    Jun. 19, 2014

(51) Int. Cl.
*H01L 23/498* (2006.01)
*H01L 23/528* (2006.01)
(Continued)

(52) U.S. Cl.
CPC .... *H01L 23/49816* (2013.01); *H01L 23/3142* (2013.01); *H01L 23/488* (2013.01); *H01L 23/5283* (2013.01); *H01L 24/11* (2013.01); *H01L 24/13* (2013.01); *H01L 24/14* (2013.01); *H01L 24/15* (2013.01); *H01L 24/16* (2013.01);
(Continued)

(58) Field of Classification Search
CPC ..... H01L 2224/48227; H01L 23/49811; H01L 2224/83; H01L 2225/06513; H01L 23/49838; H01L 24/83; H01L 2224/1405; H01L 2224/13006; H01L 2224/1403; H01L 2224/48465; H01L 2224/49113;
(Continued)

(56) References Cited

U.S. PATENT DOCUMENTS 4,811,082 A   3/1989   Jacobs et al.
4,990,462 A   2/1991   Sliwa, Jr.
(Continued)

FOREIGN PATENT DOCUMENTS

CN   101080138        11/2007
KR   1020110002816 A   1/2011
(Continued)

OTHER PUBLICATIONS

Garrou, Phil, "IFTLE 58 Fine Pitch Microjoints, Cu Pillar Bump-on-Lead, Xillinx Interposer Reliability," Solid State Technology, Insights for Electronic Manufacturing, Jul. 18, 2011, 3 pages.

*Primary Examiner* — Eduardo A Rodela
(74) *Attorney, Agent, or Firm* — Slater Matsil, LLP (57) ABSTRACT

Semiconductor devices, methods of manufacture thereof, and packaged semiconductor devices are disclosed. In one embodiment, a semiconductor device includes a substrate and conductive traces disposed over the substrate. Each of the conductive traces has a bottom region proximate the substrate and a top region opposite the bottom region. The top region has a first width and the bottom region has a second width. The second width is greater than the first width.

20 Claims, 5 Drawing Sheets

(51) Int. Cl.
*H01L 23/00* (2006.01)
*H01L 23/488* (2006.01)
*H01L 25/065* (2006.01)
*H01L 23/31* (2006.01)
*H01L 21/56* (2006.01)

(52) U.S. Cl.
CPC ........ *H01L 25/0657* (2013.01); *H01L 21/563* (2013.01); *H01L 23/3192* (2013.01); *H01L 24/81* (2013.01); *H01L 2224/0401* (2013.01); *H01L 2224/05567* (2013.01); *H01L 2224/05624* (2013.01); *H01L 2224/1146* (2013.01); *H01L 2224/11472* (2013.01); *H01L 2224/13005* (2013.01); *H01L 2224/13012* (2013.01); *H01L 2224/13013* (2013.01); *H01L 2224/13014* (2013.01); *H01L 2224/13015* (2013.01); *H01L 2224/13017* (2013.01); *H01L 2224/13022* (2013.01); *H01L 2224/1357* (2013.01); *H01L 2224/13083* (2013.01); *H01L 2224/13111* (2013.01); *H01L 2224/13144* (2013.01); *H01L 2224/13147* (2013.01); *H01L 2224/13155* (2013.01); *H01L 2224/13164* (2013.01); *H01L 2224/13166* (2013.01); *H01L 2224/13565* (2013.01); *H01L 2224/13686* (2013.01); *H01L 2224/16058* (2013.01); *H01L 2224/16238* (2013.01); *H01L 2224/73104* (2013.01); *H01L 2224/8182* (2013.01); *H01L 2224/81191* (2013.01); *H01L 2224/81192* (2013.01); *H01L 2224/81815* (2013.01); *H01L 2224/83104* (2013.01); *H01L 2224/94* (2013.01); *H01L 2225/06513* (2013.01); *H01L 2924/00014* (2013.01); *H01L 2924/15787* (2013.01); *H01L 2924/181* (2013.01); *H01L 2924/3841* (2013.01)

(58) Field of Classification Search
CPC ......... H01L 2224/81385; H01L 23/528; H01L 2224/81395; H01L 24/15
USPC .......... 29/829, 831, 846, 850; 257/734, 737, 257/738, 739, 773, 778, 779, 786, 257/E23.06, E23.068, E23.069, E23.07, 257/E23.175
See application file for complete search history.

(56) References Cited

U.S. PATENT DOCUMENTS

| | | |
|---|---|---|
| 5,075,253 A | 12/1991 | Sliwa, Jr. |
| 5,075,965 A | 12/1991 | Carey et al. |
| 5,130,779 A | 7/1992 | Agarwala et al. |
| 5,277,756 A | 1/1994 | Dion |
| 5,334,804 A | 8/1994 | Love et al. |
| 5,380,681 A | 1/1995 | Hsu |
| 5,431,328 A | 7/1995 | Chang et al. |
| 5,440,239 A | 8/1995 | Zappella et al. |
| 5,470,787 A | 11/1995 | Greer |
| 5,481,133 A | 1/1996 | Hsu |
| 5,542,601 A | 8/1996 | Fallon et al. |
| 5,587,337 A | 12/1996 | Idaka et al. |
| 5,641,996 A * | 6/1997 | Omoya ................. H01L 21/563 257/780 |
| 5,680,187 A | 10/1997 | Nagayama et al. |
| 5,790,377 A | 8/1998 | Schreiber et al. |
| 5,796,591 A | 8/1998 | Dalal et al. |
| 5,816,478 A | 10/1998 | Kaskoun et al. |
| 5,889,326 A | 3/1999 | Tanaka |
| 5,977,599 A | 11/1999 | Adrian |
| 6,002,172 A | 12/1999 | Desai et al. |
| 6,002,177 A | 12/1999 | Gaynes et al. |
| 6,025,650 A | 2/2000 | Tsuji et al. |
| 6,082,610 A | 7/2000 | Shangguan et al. |
| 6,091,141 A | 7/2000 | Heo |
| 6,093,964 A * | 7/2000 | Saitoh ................. H01L 24/11 257/738 |
| 6,130,476 A | 10/2000 | LaFontaine, Jr. et al. |
| 6,137,184 A * | 10/2000 | Ikegami ............. H01L 21/4853 257/734 |
| 6,181,010 B1 | 1/2001 | Nozawa |
| 6,184,062 B1 * | 2/2001 | Brofman ................. H01L 24/11 257/738 |
| 6,187,678 B1 | 2/2001 | Gaynes et al. |
| 6,214,642 B1 * | 4/2001 | Chen et al. ................... 438/108 |
| 6,229,216 B1 | 5/2001 | Ma et al. |
| 6,236,115 B1 | 5/2001 | Gaynes et al. |
| 6,249,051 B1 | 6/2001 | Chang et al. |
| 6,250,541 B1 | 6/2001 | Shangguan et al. |
| 6,271,059 B1 | 8/2001 | Bertin et al. |
| 6,279,815 B1 | 8/2001 | Correia et al. |
| 6,291,891 B1 | 9/2001 | Higashi et al. |
| 6,346,469 B1 | 2/2002 | Greer |
| 6,355,501 B1 | 3/2002 | Fung et al. |
| 6,358,847 B1 | 3/2002 | Li et al. |
| 6,424,037 B1 | 7/2002 | Ho et al. |
| 6,434,016 B2 | 8/2002 | Zeng et al. |
| 6,448,661 B1 | 9/2002 | Kim et al. |
| 6,448,663 B1 | 9/2002 | Uchiyama |
| 6,461,895 B1 | 10/2002 | Liang et al. |
| 6,492,197 B1 | 12/2002 | Rinne |
| 6,498,308 B2 | 12/2002 | Sakamoto |
| 6,518,096 B2 * | 2/2003 | Chan ....................... H01L 24/11 257/E21.508 |
| 6,562,653 B1 | 5/2003 | Ma et al. |
| 6,562,657 B1 | 5/2003 | Lin |
| 6,570,248 B1 | 5/2003 | Ahn et al. |
| 6,573,598 B2 | 6/2003 | Ohuchi et al. |
| 6,578,754 B1 | 6/2003 | Tung |
| 6,583,846 B1 | 6/2003 | Yanagawa et al. |
| 6,592,019 B2 | 7/2003 | Tung |
| 6,600,222 B1 | 7/2003 | Levardo |
| 6,607,938 B2 | 8/2003 | Kwon et al. |
| 6,617,247 B2 * | 9/2003 | Goodwin ..................... 438/680 |
| 6,622,907 B2 | 9/2003 | Fanti et al. |
| 6,661,085 B2 | 12/2003 | Kellar et al. |
| 6,713,844 B2 | 3/2004 | Tatsuta et al. |
| 6,762,076 B2 | 7/2004 | Kim et al. |
| 6,777,778 B2 | 8/2004 | Sato |
| 6,790,748 B2 | 9/2004 | Kim et al. |
| 6,815,252 B2 * | 11/2004 | Pendse ........................ 438/107 |
| 6,852,564 B2 | 2/2005 | Ohuchi et al. |
| 6,876,088 B2 | 4/2005 | Harvey |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,940,169 B2 | 9/2005 | Jin et al. |
| 6,940,178 B2 | 9/2005 | Kweon et al. |
| 6,943,067 B2 | 9/2005 | Greenlaw |
| 6,946,384 B2 | 9/2005 | Kloster et al. |
| 6,972,490 B2 | 12/2005 | Chang et al. |
| 6,975,016 B2 | 12/2005 | Kellar et al. |
| 6,998,216 B2 | 2/2006 | He et al. |
| 7,033,859 B2 | 4/2006 | Pendse |
| 7,037,804 B2 | 5/2006 | Kellar et al. |
| 7,056,807 B2 | 6/2006 | Kellar et al. |
| 7,087,538 B2 | 8/2006 | Staines et al. |
| 7,135,766 B1 | 11/2006 | Costa et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,271,483 B2 | 9/2007 | Lin et al. |
| 7,271,484 B2 | 9/2007 | Reiss et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,382,049 B2 | 6/2008 | Ho et al. |
| 7,402,442 B2 | 7/2008 | Condorelli et al. |

(56) References Cited

U.S. PATENT DOCUMENTS

| | | | |
|---|---|---|---|
| 7,402,508 B2 | 7/2008 | Kaneko | |
| 7,402,515 B2 | 7/2008 | Arana et al. | |
| 7,410,884 B2 | 8/2008 | Ramanathan et al. | |
| 7,413,995 B2 | 8/2008 | Sterrett et al. | |
| 7,414,319 B2 | 8/2008 | Lin et al. | |
| 7,432,592 B2 | 10/2008 | Shi et al. | |
| 7,459,785 B2 | 12/2008 | Daubenspeck et al. | |
| 7,470,996 B2 | 12/2008 | Yoneyama et al. | |
| 7,494,845 B2 | 2/2009 | Hwang et al. | |
| 7,495,179 B2 | 2/2009 | Kubota et al. | |
| 7,528,494 B2 | 5/2009 | Furukawa et al. | |
| 7,531,890 B2 | 5/2009 | Kim | |
| 7,554,201 B2 | 6/2009 | Kang et al. | |
| 7,557,597 B2 | 7/2009 | Anderson et al. | |
| 7,576,435 B2 | 8/2009 | Chao | |
| 7,615,476 B2 | 11/2009 | Hua | |
| 7,659,631 B2 | 2/2010 | Kamins et al. | |
| 7,765,686 B2 | 8/2010 | Murakami et al. | |
| 7,804,177 B2 | 9/2010 | Lu | |
| 7,829,265 B2 | 11/2010 | Kitada et al. | |
| 7,834,450 B2 | 11/2010 | Kang | |
| 7,902,666 B1 | 3/2011 | Hsu et al. | |
| 7,946,331 B2 | 5/2011 | Trezza et al. | |
| 8,076,232 B2 | 12/2011 | Pendse | |
| 8,093,729 B2 | 1/2012 | Trezza | |
| 8,120,175 B2 | 2/2012 | Farooq et al. | |
| 8,130,475 B2 | 3/2012 | Kawamori et al. | |
| 8,158,489 B2 | 4/2012 | Huang et al. | |
| 8,207,604 B2 | 6/2012 | Haba et al. | |
| 8,232,640 B2 | 7/2012 | Tomoda et al. | |
| 8,241,963 B2 | 8/2012 | Shen et al. | |
| 8,269,345 B2 | 9/2012 | Patel | |
| 8,299,616 B2 | 10/2012 | Chuang et al. | |
| 8,318,596 B2 | 11/2012 | Kuo et al. | |
| 8,350,384 B2* | 1/2013 | Pendse | 257/734 |
| 8,368,213 B2 | 2/2013 | Lee et al. | |
| 8,435,881 B2 | 5/2013 | Choi et al. | |
| 8,502,377 B2 | 8/2013 | Lin et al. | |
| 8,558,379 B2* | 10/2013 | Kwon | H01L 23/49816 |
| | | | 257/737 |
| 8,697,492 B2* | 4/2014 | Haba et al. | 438/108 |
| 8,922,011 B2* | 12/2014 | Osumi et al. | 257/737 |
| 9,018,758 B2* | 4/2015 | Hwang et al. | 257/734 |
| 9,029,196 B2* | 5/2015 | Pendse | 438/107 |
| 2001/0000929 A1* | 5/2001 | Gilleo | H01L 21/563 |
| | | | 257/795 |
| 2001/0013423 A1 | 8/2001 | Dalal et al. | |
| 2002/0033412 A1 | 3/2002 | Tung | |
| 2002/0046856 A1* | 4/2002 | Alcoe | 174/52.1 |
| 2002/0100974 A1 | 8/2002 | Uchiyama | |
| 2002/0106832 A1 | 8/2002 | Hotchkiss et al. | |
| 2002/0197811 A1 | 12/2002 | Sato | |
| 2003/0092219 A1 | 5/2003 | Ohuchi et al. | |
| 2004/0140538 A1 | 7/2004 | Harvey | |
| 2004/0159944 A1 | 8/2004 | Datta et al. | |
| 2004/0212098 A1 | 10/2004 | Pendse | |
| 2005/0062153 A1 | 3/2005 | Saito et al. | |
| 2005/0161670 A1* | 7/2005 | Kimura | 257/59 |
| 2005/0212114 A1 | 9/2005 | Kawano et al. | |
| 2006/0012024 A1 | 1/2006 | Lin et al. | |
| 2006/0038303 A1 | 2/2006 | Sterrett et al. | |
| 2006/0051954 A1 | 3/2006 | Lin et al. | |
| 2006/0055032 A1 | 3/2006 | Chang et al. | |
| 2006/0209245 A1 | 9/2006 | Mun et al. | |
| 2006/0292824 A1 | 12/2006 | Beyne et al. | |
| 2007/0001280 A1 | 1/2007 | Hua | |
| 2007/0001318 A1* | 1/2007 | Starkston et al. | 257/782 |
| 2007/0012337 A1 | 1/2007 | Hillman et al. | |
| 2007/0018294 A1 | 1/2007 | Sutardja | |
| 2007/0020906 A1 | 1/2007 | Chiu et al. | |
| 2007/0023483 A1 | 2/2007 | Yoneyama et al. | |
| 2007/0200234 A1 | 8/2007 | Gerber et al. | |
| 2008/0128911 A1 | 6/2008 | Koyama | |
| 2008/0142968 A1* | 6/2008 | Jadhav et al. | 257/738 |
| 2008/0150135 A1 | 6/2008 | Oyama et al. | |
| 2008/0218061 A1 | 9/2008 | Chao et al. | |
| 2008/0277785 A1 | 11/2008 | Hwan et al. | |
| 2009/0025215 A1 | 1/2009 | Murakami et al. | |
| 2009/0042144 A1 | 2/2009 | Kitada et al. | |
| 2009/0045453 A1* | 2/2009 | Heo | 257/324 |
| 2009/0075469 A1 | 3/2009 | Furman et al. | |
| 2009/0096092 A1 | 4/2009 | Patel | |
| 2009/0108443 A1 | 4/2009 | Jiang | |
| 2009/0127708 A1* | 5/2009 | Lee et al. | 257/737 |
| 2009/0149016 A1* | 6/2009 | Park | H01L 24/11 |
| | | | 438/614 |
| 2009/0166861 A1 | 7/2009 | Lehr et al. | |
| 2009/0174067 A1 | 7/2009 | Lin | |
| 2009/0258460 A1* | 10/2009 | Oi et al. | 438/108 |
| 2010/0007019 A1 | 1/2010 | Pendse | |
| 2010/0044860 A1 | 2/2010 | Haba et al. | |
| 2010/0141880 A1 | 6/2010 | Koito et al. | |
| 2010/0276787 A1 | 11/2010 | Yu et al. | |
| 2010/0314745 A1 | 12/2010 | Masumoto et al. | |
| 2010/0327422 A1 | 12/2010 | Lee et al. | |
| 2011/0001250 A1 | 1/2011 | Lin et al. | |
| 2011/0038147 A1 | 2/2011 | Lin et al. | |
| 2011/0169158 A1 | 7/2011 | Varanasi | |
| 2011/0177686 A1 | 7/2011 | Zeng | |
| 2011/0186986 A1 | 8/2011 | Chuang et al. | |
| 2011/0193220 A1 | 8/2011 | Kuo et al. | |
| 2011/0248399 A1* | 10/2011 | Pendse | 257/737 |
| 2011/0260317 A1 | 10/2011 | Lu et al. | |
| 2011/0285011 A1 | 11/2011 | Hwang et al. | |
| 2011/0285023 A1 | 11/2011 | Shen et al. | |
| 2012/0007231 A1 | 1/2012 | Chang | |
| 2012/0012997 A1 | 1/2012 | Shen et al. | |
| 2012/0091577 A1* | 4/2012 | Hwang | H01L 24/11 |
| | | | 257/737 |
| 2012/0098120 A1 | 4/2012 | Yu et al. | |
| 2012/0146168 A1 | 6/2012 | Hsieh et al. | |
| 2012/0306080 A1 | 12/2012 | Yu et al. | |
| 2013/0026622 A1 | 1/2013 | Chuang et al. | |
| 2013/0087920 A1 | 4/2013 | Jeng et al. | |
| 2013/0093079 A1 | 4/2013 | Tu et al. | |
| 2013/0270699 A1 | 10/2013 | Kuo et al. | |
| 2013/0277830 A1 | 10/2013 | Yu et al. | |
| 2013/0288473 A1 | 10/2013 | Chuang et al. | |
| 2014/0054764 A1 | 2/2014 | Lu et al. | |
| 2014/0061897 A1 | 3/2014 | Lin et al. | |
| 2014/0061924 A1 | 3/2014 | Chen et al. | |
| 2014/0077358 A1 | 3/2014 | Chen et al. | |
| 2014/0077360 A1 | 3/2014 | Lin et al. | |
| 2014/0077365 A1 | 3/2014 | Lin et al. | |
| 2014/0110847 A1 | 4/2014 | Tseng et al. | |

FOREIGN PATENT DOCUMENTS

| | | |
|---|---|---|
| KR | 1020110128532 A | 11/2011 |
| TW | 200826265 | 6/2008 |
| TW | 200915452 | 4/2009 |

\* cited by examiner

SEMICONDUCTOR DEVICES, METHODS OF MANUFACTURE THEREOF, AND PACKAGED SEMICONDUCTOR DEVICES

CROSS-REFERENCE TO RELATED APPLICATIONS

This application relates to the following co-pending and commonly assigned U.S. patent applications: Ser. No. 13/449,078, filed on Apr. 17, 2012, entitled, "Conical-shaped or Tier-Shaped Pillar Connections," and Ser. No. 13/658,895, filed on Oct. 24, 2012, entitled, "Bump-on Trace Interconnection Structure for Flip-Chip Packages," which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of packaging for semiconductor devices is referred to as a bump-on-trace (BOT) package. Conductive bumps are formed on dies of a semiconductor wafer, and the dies are singulated. The dies or "flip chips" are attached or soldered to traces on the BOT packages using a solder reflow process.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Novel semiconductor devices, methods of manufacture thereof, and packaged semiconductor devices and packaging methods will be described herein.

Figure 1:
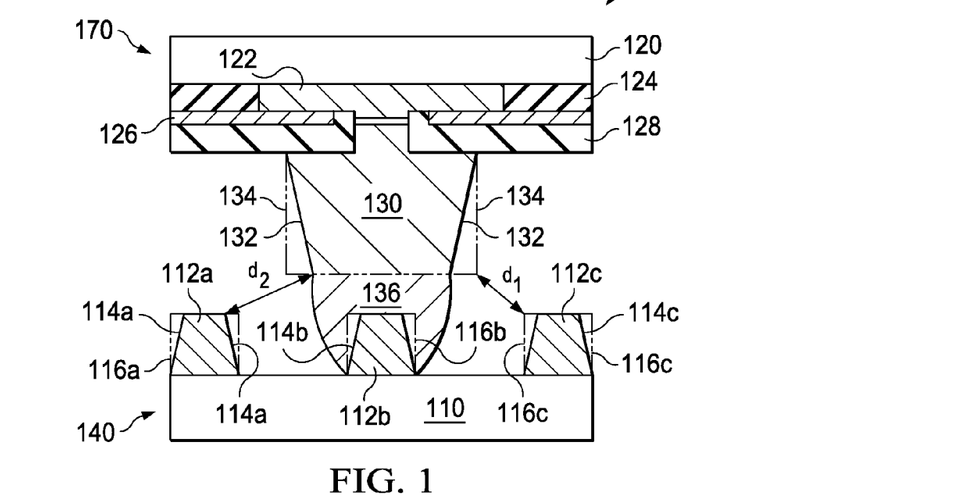
FIG. 1 is a cross-sectional view of a portion of a packaged semiconductor device in accordance with some embodiments of the present disclosure.

Referring first to FIG. 1, there is shown a cross-sectional view of a portion of a packaged semiconductor device 100 in accordance with some embodiments of the present disclosure. The packaged semiconductor device 100 includes a semiconductor device 170 that is attached to a semiconductor device 140. Semiconductor device 170 includes a conductive bump 130 formed thereon, and semiconductor device 140 includes a plurality of conductive traces 112a, 112b, and 112c formed thereon. Only one conductive bump 130 is shown in the drawings; however, a plurality of conductive bumps 130 is formed on a surface of the semiconductor device 170, not shown. The conductive bumps 130 of semiconductor device 170 are attached to one of the conductive traces 112b of semiconductor device 140 by a solder joint 136.

In accordance some embodiments of the present disclosure, the conductive traces 112a, 112b, and 112c of semiconductor device 140 have tapered sidewalls 114a, 114b, and 114c, respectively. In accordance with some embodiments, the conductive bumps 130 of semiconductor device 170 also have tapered sidewalls 132. In other embodiments, the conductive bumps 130 have substantially vertical sidewalls 134, shown in phantom (e.g., shown in dashed lines).

Semiconductor device 140 includes a substrate 110. The conductive traces 112a, 112b, and 112c are formed on a top surface of the substrate 110. The semiconductor device 140 may include other material layers, to be described further herein.

Semiconductor device 170 also includes a substrate 120. A conductive pad 122 comprising Al or other conductive materials is formed within an insulating material layer 124 disposed on the substrate 120. The conductive pads 122 comprise a portion of a redistribution layer (RDL) in some embodiments, for example. An insulating material layer 126 is disposed on insulating material layer 124 and portions of the conductive pads 122. Insulating material layers 124 and 126 are passivation layers comprised of a dielectric material, such as silicon dioxide, silicon nitride, a polymer, other insulators, or combinations or multiple layers thereof, as examples. A stress buffer layer 128 comprised of a polyimide material or other insulating material is disposed on the insulating material layer 126.

Conductive bumps 130 comprising tapered sidewalls 130 may be formed over portions of the contact pads 122 and the stress buffer layer 128, using a method described in U.S. patent application Ser. No. 13/449,078, filed on Apr. 17, 2012 and entitled, "Conical-shaped or Tier-Shaped Pillar Connections," which is incorporated herein by reference. Alternatively, the conductive bumps 130 may be formed using other methods, and the conductive bumps 130 may have substantially vertical sidewalls. Conductive bumps 130 may include a layer of solder formed thereon. The semiconductor device 170 is inverted or 'flipped', and the semiconductor device 170 is then attached to semiconductor device 140, aligning the conductive bumps 130 with the solder formed thereon to one of the conductive traces 112b of semiconductor device 140. A solder reflow process is used to melt the solder on the conductive bumps 130, and after the solder cools, a solder joint 136 is formed between the conductive bump 130 and the conductive trace 112b, which electrically and mechanically connects semiconductor device 170 to semiconductor device 140.

In some embodiments, the conductive bumps 130 comprise a material stack. The material stack of the conductive bumps 130 may comprise a Cu pillar/solder, Cu pillar/Ni/solder, Cu pillar/Au/solder, Cu pillar/Pd/solder, Cu pillar/Ti/solder, other material stack combinations, or multiple layers or combinations thereof, in some embodiments. If the material stack of the conductive bumps 130 includes solder, the solder may comprise tin, silver, lead-free tin, copper, other materials, or multiple layers or combinations thereof in some embodiments. Alternatively, the conductive bumps 130 may comprise other materials.

In some embodiments, the conductive bumps 130 do not include solder. The solder joint 136 may be formed in these embodiments by forming solder balls at predetermined locations along the conductive trace 112b or by applying solder when attaching the semiconductor device 170 to semiconductor device 140. In some embodiments, a solderless direct bonding method may comprise three processing steps: first, cleaning the pillar (the conductive bump 130) top surface; second, pillar-pillar or pillar-conductive trace alignment; and third, a permanent bonding process. An additional batch annealing step can then be used to increase the bonding strength. The solder joint 136 may be formed using a non-wetting solder process in some embodiments, for example. The non-wetting solder process reduces a bridging potential of the solder joint 136 to an adjacent conductive trace 112a or 112c, in some embodiments.

In some embodiments, the solder joint 136 comprises Sn, SnAg, SnPb, SnAgCu, SnAgZn, SnZn, SnBi—In, Sn—In, Sn—Au, SnCu, SnZnIn, or SnAgSb, as examples. Alternatively, the solder joint 136 may comprise other materials.

In some embodiments, semiconductor device 140 comprises a bump-on-trace (BOT) packaging device, and semiconductor device 170 comprises an integrated circuit die. The packaged semiconductor device 100 comprises an integrated circuit die 170 packaged using the BOT packaging device 140 in these embodiments. In other embodiments, semiconductor device 140 or 170 may include a substrate 110 or 120, respectively, that comprises an integrated circuit die, an interposer, a packaging device, a printed circuit board (PCB), a high-density interconnect, an organic substrate, a ceramic substrate, or a bump-on-trace (BOT) package, as examples. Alternatively, the substrates 110 and 120 may comprise other types of devices.

The packaged semiconductor device 100 illustrated in FIG. 1 is advantageous in some embodiments because the distances between the corners (i.e., the corner edges) of the neighboring conductive traces 112a and 112c and conductive bump 130 is minimized. For example, dimension $d_1$ illustrates a distance between a corner edge of an adjacent conductive trace 112c having a conventional vertical sidewall 116c (illustrated in phantom or by dashed lines) and a corner edge of a conductive bump 130 having a vertical sidewall 134 (also illustrated in phantom). Dimension $d_1$ comprises about 10.0 µm to 17.5 µm for an under-bump 130 pitch of about 80 µm in some embodiments, as an example. Alternatively, dimension $d_1$ may comprise other values.

Dimension $d_2$ illustrates a distance between a corner edge of an adjacent conductive trace 112a having a tapered sidewall 114a and a corner edge of a conductive bump 130 having a tapered sidewall 132. Dimension $d_2$ comprises dimension $d_1$+about (3 µm to 10 µm) in some embodiments, as an example. Dimension $d_2$ may comprise about 13 µm to 27.5 µm in some embodiments, for example. Alternatively, dimension $d_2$ may comprise other values. Dimension $d_2$ is greater than dimension $d_1$, which provides an increased clearance that reduces the likelihood of unwanted bridging and shorts forming between the solder joint 136 and neighboring conductive traces 112a and 112c. Furthermore, the increased distance comprising dimension $d_2$ provides the ability to place the conductive traces 112a, 112b, and 112c more closely together in some embodiments, providing a more aggressive conductive trace 112 (i.e., conductive traces 112a, 112b, and 112c) spacing rule. Further advantages are also provided by embodiments of the present disclosure, to be described further herein.

FIGS. 2 through 7 are cross-sectional views illustrating a portion of a semiconductor device 140 including the conductive traces 112 comprising tapered sidewalls 114 at various stages of manufacturing in accordance with some embodiments. To manufacture the semiconductor device, first, a substrate 110 is provided. The substrate 110 may include a semiconductor substrate comprising silicon or other materials and may be covered by an insulating layer, for example. The substrate 110 may include active or passive components or circuits, not shown. The substrate 110 may comprise silicon oxide over single-crystal silicon, for example. The substrate 110 may include conductive layers or semiconductor elements, such as transistors, diodes, resistors, capacitors, inductors, etc. Compound semiconductors, GaAs, InP, Si/Ge, or SiC, as examples, may be used in place of silicon. The substrate 110 may comprise a silicon-on-insulator (SOI) or a germanium-on-insulator (GOI) substrate, as examples.

Figure 2:
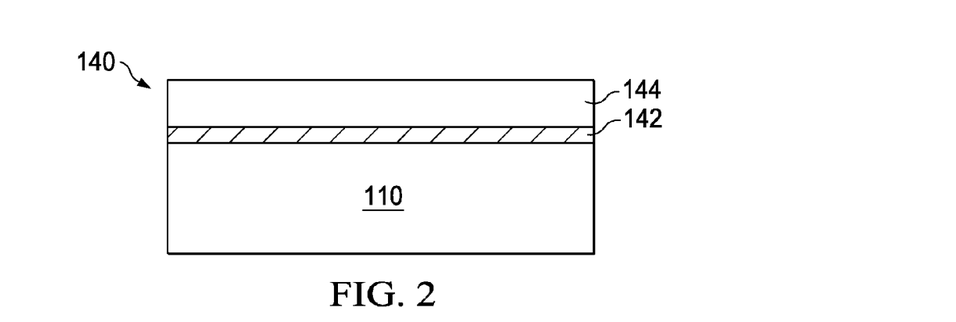
FIGS. 2 through 7 are cross-sectional views of a portion of a semiconductor device at various stages of manufacturing in accordance with some embodiments.

A seed layer 142 is formed over the substrate 110 in some embodiments. The seed layer 142 may be formed using a sputter process or other deposition methods, for example. In some embodiments, the seed layer 142 comprises Cu or a Cu alloy having a thickness of about 1,000 to 3,000 Angstroms, for example. Alternatively, the seed layer 142 may comprise other materials and dimensions, and the seed layer 142 may not be included.

A layer of photoresist 144 is formed over the seed layer 142. The photoresist 144 comprises a negative photoresist in some embodiments, although alternatively, a positive photoresist may be used. The photoresist 144 comprises a layer of resist having a gradient absorption of a predetermined spectrum of energy, in some embodiments. The photoresist 144 includes an absorption material in some embodiments, to be described further herein.

Figure 3:
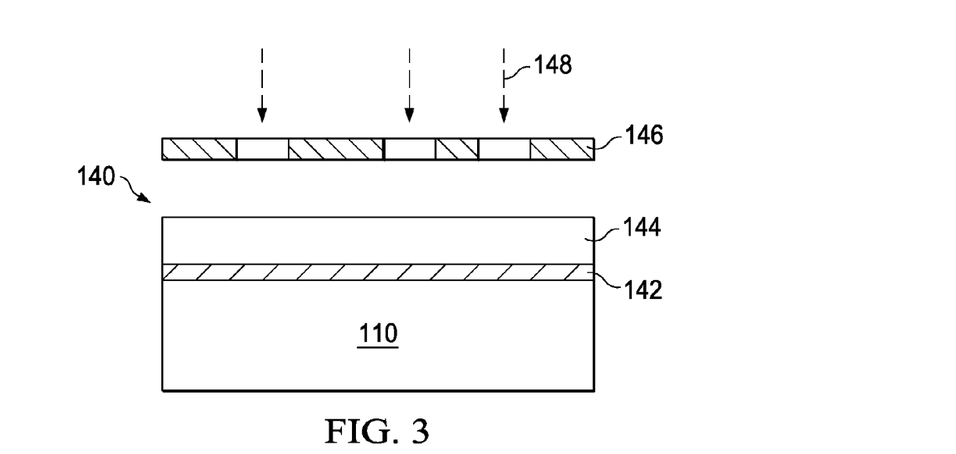

Next, the photoresist 144 is exposed using a lithography process, as illustrated in FIG. 3. The photoresist 144 is exposed to energy 148 comprising radiation or light, as examples, that is reflected from or through a lithography mask 146 comprising a desired pattern formed thereon. A lithography mask 146 comprising a binary mask is illustrated in FIG. 3, as an example. Other types of masks 146 may alternatively be used. A direct patterning method may alternatively be used to pattern the photoresist 144, as another example.

Figure 4:
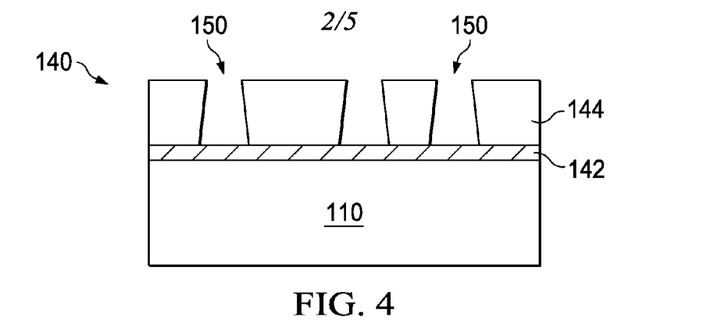

The photoresist 144 is then developed, and exposed portions (or unexposed portions, if a positive photoresist is used) are ashed or etched away, leaving patterns 150 in the photoresist 144, as shown in FIG. 4. The patterns 150 are larger at a bottom portion of the photoresist 144 proximate the substrate 110 (e.g., proximate the seed layer 142) than at a top portion of the photoresist 144 opposite the bottom portion of the photoresist 144. The patterns 150 comprise a trapezoidal shape in a cross-sectional view in some embodiments, for example. The patterns 150 comprise tapered sidewalls. In some embodiments, the sidewalls of the patterns 150 may comprise a stair-shape or ladder shape (see sidewalls 151 shown FIG. 11 in phantom).

Figure 5:
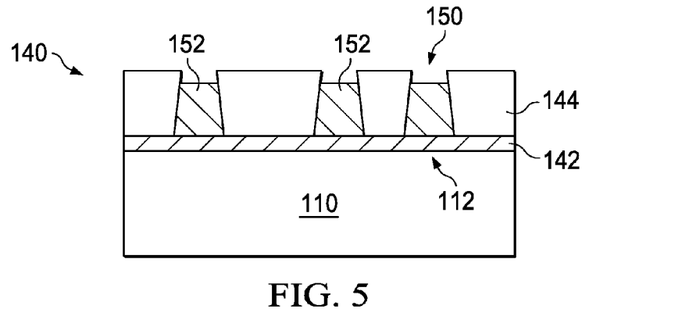

Referring next to FIG. 5, a conductive material 152 is formed within the patterns 150 in the photoresist 144. The conductive material 152 is formed using a plating process in some embodiments. The plating process may comprise electroplating, electroless plating, or the like. Alternatively, the conductive material 152 may be formed using a deposition process or other methods. The conductive material 152 conforms to the shape of the patterns 150 in the photoresist 144 and thus, also has tapered sidewalls, stair-shaped sidewalls, or ladder shaped sidewalls.

As an example, in some embodiments, an electroplating process is used to form the conductive material 152, wherein a wafer including the substrate 110 is submerged or immersed in an electroplating solution. The wafer surface is electrically connected to a negative side of an external direct current (DC) power supply such that the wafer functions as a cathode in the electroplating process. A solid conductive anode, such as a copper anode, is also immersed in the electroplating solution and is attached to a positive side of the DC power supply. Atoms from the anode are dissolved into the solution, from which the cathode (e.g., the wafer) acquires, thereby plating the exposed conductive areas of the wafer, e.g., exposed portions of the seed layer 142 within the openings 150 in the layer of photoresist 144.

Figure 6:
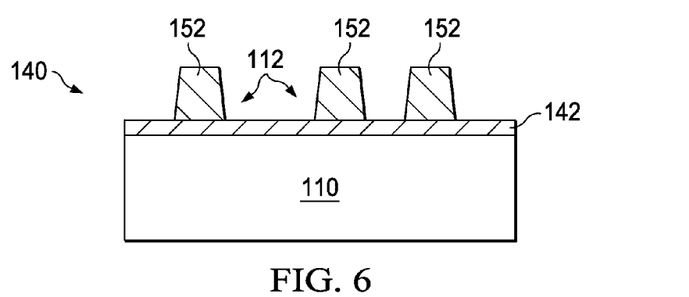
Figure 7:
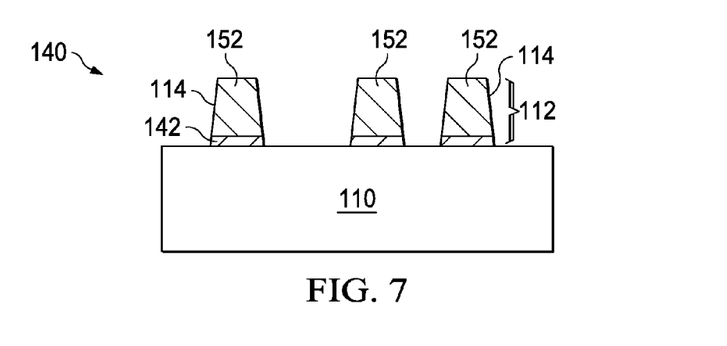

The photoresist 144 is then removed, as shown in FIG. 6. Exposed portions of the seed layer 142 residing over the substrate 110 are removed using an etch process suitable for the material of the seed layer 142, as shown in FIG. 7. The exposed portions of the seed layer 142 may be removed by, for example, a wet etching process. The conductive traces 112 comprise the seed layer 142 and the conductive material 152.

The seed layer 142 and/or the conductive material 152 of the conductive traces 112 may comprise copper, aluminum, tungsten, nickel, palladium, gold, or combinations or multiple layers thereof, in some embodiments. For example, the seed layer 142 and/or the conductive material 152 may comprise substantially pure copper, aluminum copper, combinations thereof, other metallic materials such as tungsten, nickel, palladium, gold, and/or alloys thereof. The seed layer 142 and the conductive material 152 of the conductive traces 112 comprise a total height or thickness of about 10 to 35 µm in some embodiments, for example. Alternatively, the conductive traces 112 may comprise other materials and dimensions. The conductive traces 112 comprise tapered sidewalls 114.

Figure 8:
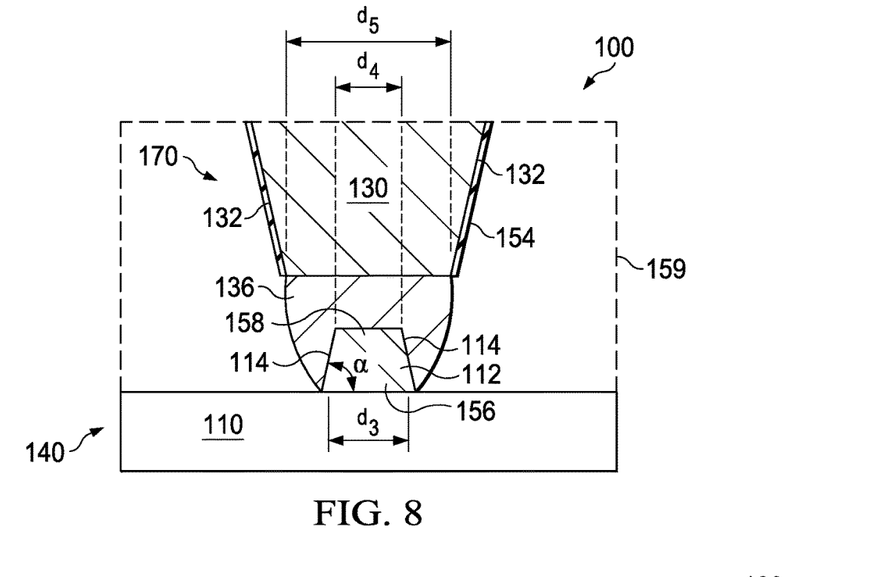
FIG. 8 is a cross-sectional view of a portion of a packaged semiconductor device in accordance with some embodiments.

A more detailed view of a conductive trace 112 coupled to a conductive bump 130 comprising tapered sidewalls 132 by a solder joint 136 is shown in FIG. 8, which is a cross-sectional view of a portion of a packaged semiconductor device 100 in accordance with some embodiments. An angle α of the tapered sidewalls 114 with respect to a top surface of the substrate comprises about 75° to 89° in some embodiments, for example. In some embodiments, the angle α of the tapered sidewalls 114 comprises about 80°. Alternatively, the angle α of the tapered sidewalls 114 of the conductive traces 112 may comprise other dimensions.

The conductive trace 112 comprises sidewalls 114 that taper downwardly from a top surface to a bottom surface of the conductive trace 112 on at least two sides. The conductive trace 112 comprises a bottom region 156 proximate the substrate 110 and a top region 158 opposite (e.g., disposed above or over) the bottom region 156. The bottom region 156 comprises a width comprising dimension $d_3$, and the top region 158 comprises a width comprising dimension $d_4$. Dimension $d_3$ comprises about 10 µm to 25 µm in some embodiments, as an example. Dimension $d_4$ comprises about 7.5 µm to 24.25 µm in some embodiments, as an example. Alternatively, dimensions $d_3$ and $d_4$ may comprise other values.

Dimension $d_3$ is greater than dimension $d_4$ in some embodiments; i.e., the width of the bottom region 156 is greater than the width of the top region 158 of the conductive trace 112. The width comprising $d_4$ of the top region 158 is about 0.75 to 0.97 times the width comprising dimension $d_3$ of the bottom region 156 in some embodiments, as an example. A ratio of the top region 158 width $d_4$ to the bottom region 156 width $d_3$ comprises a range between about 0.75 to 0.97, for example. The ratio of the top region 158 to the bottom region 156 may be adjusted for a particular purpose or application. For example, the ratio of $d_4$ to $d_3$ may comprise about 0.5 to 0.99 in some embodiments. Alternatively, dimensions $d_3$ and $d_4$ may comprise other relative values.

The conductive trace 112 comprises a trapezoidal shape in a cross-sectional view in some embodiments. Alternatively, the conductive trace 112 may comprise other shapes, in other embodiments.

FIG. 8 also illustrates relative dimensions of the bottom surface of the conductive bump 130 comprising dimension $d_5$ and the top portion of the conductive trace 112 comprising dimension $d_4$. A bottom surface of the conductive bump 130 is coupled to the top surface (or top surface of the top portion) of the conductive trace 112 by the solder joint 136. Dimension $d_5$ comprising the width of the bottom surface of the conductive bump 130 is greater than dimension $d_4$ comprising the width of the top portion 158 of the conductive trace 112 in some embodiments, for example. Dimension $d_5$ comprises about 15 µm to 45 µm in some embodiments, as an example. Alternatively, dimension $d_5$ may comprise other values.

A metal oxide 154 is formed on sidewalls 132 of the conductive bump 130 in some embodiments, also shown in FIG. 8. The metal oxide 154 comprises copper oxide in some embodiments, although alternatively, the metal oxide 154 may comprise other materials. The metal oxide 154 may comprise a material of the conductive bump 130 combined with oxygen in some embodiments, as another example. The metal oxide 154 comprises a thickness of about 10 Angstroms to 1,000 Angstroms, as an example. Alternatively, the metal oxide 154 may comprise other dimensions. The metal oxide 154 is advantageous in some embodiments, e.g., wherein a molding compound and/or underfill material 159 (shown in phantom in FIG. 8) is applied between semiconductor device 140 and semiconductor device 170. The molding compound and/or underfill material 159 is later dispensed or formed between the substrate 110 of semiconductor device 140 and the substrate 120 of semiconductor device 170 in some embodiments. In other embodiments, the molding compound and/or underfill material 159 is not included. The metal oxide 154 improves adhesion of the conductive bump 130 to the molding compound and/or underfill material 159 in some embodiments, preventing or reducing potential delamination problems of the packaged semiconductor device 100.

Figure 9:
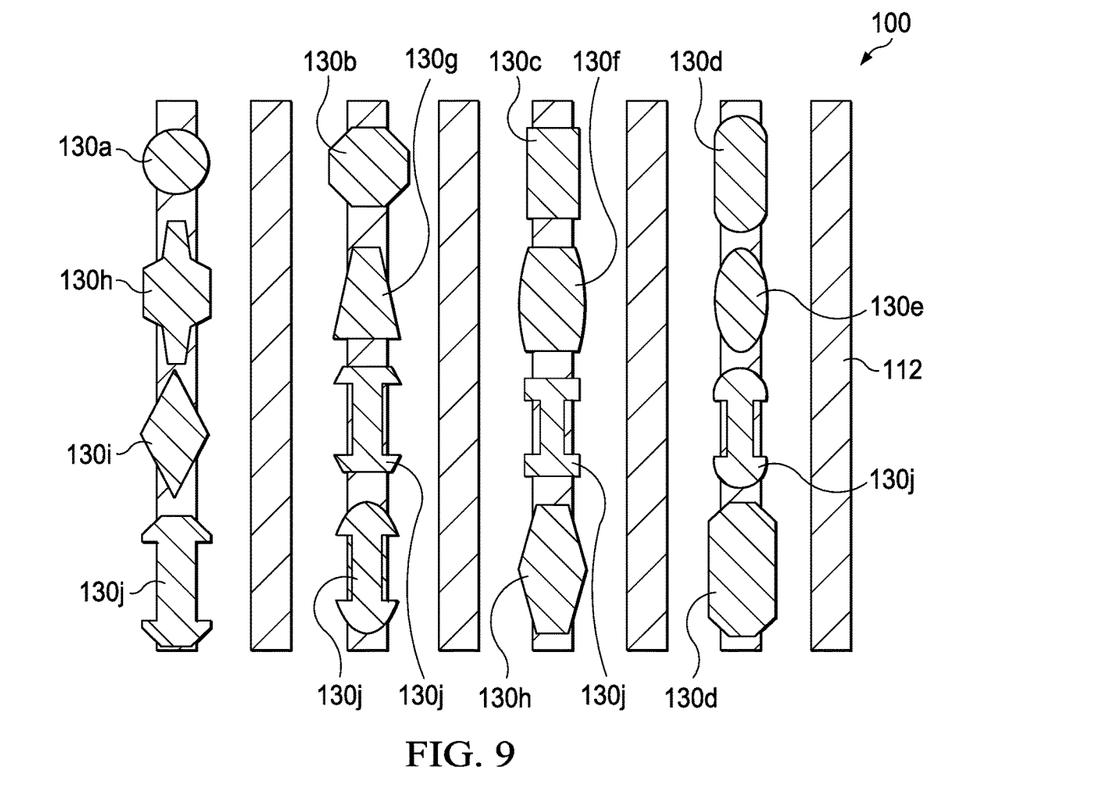
FIG. 9 is a top view of a portion of a packaged semiconductor device in accordance with some embodiments.

FIG. 9 is a top view of a portion of a packaged semiconductor device 100 in accordance with some embodiments. Examples of possible shapes of the conductive bumps 130a, 130b, 130c, 130d, 130e, 130f, 130g, 130h, 130i, and 130j in a top view in accordance with some embodiments are shown. The conductive bumps 130a, 130b, 130c, 130d, 130e, 130f, 130g, 130h, 130i, and 130j are shown disposed over a plurality of conductive traces 112. Some conductive bumps 130a may be circular in the top view, and other conductive bumps 130b may be octagon-shaped. Other conductive bumps 130c may be rectangular, and other conductive bumps 130d may be capsule-shaped. Some conductive bumps 130e may be oval or elliptical in a top view, and other conductive bumps 130f may be barrel-shaped. Some conductive bumps 130g may be trapezoidal-shaped, while other conductive bumps 130h may comprise greater than four sides arranged in geometric patterns, such as a hexagon, for example. Some conductive bumps 130i may be diamond-shaped in a top view, and other conductive bumps 130j may be dumbbell shaped. One or more of the conductive bumps 130 (e.g., conductive bumps 130a, 130b, 130c, 130d, 130e, 130f, 130g, 130h, 130i, and 130j described herein) may comprise these and other alternative shapes, such as ladder-shaped, asymmetrically-shaped, or symmetrically-shaped, as additional examples, not shown.

Figure 10:
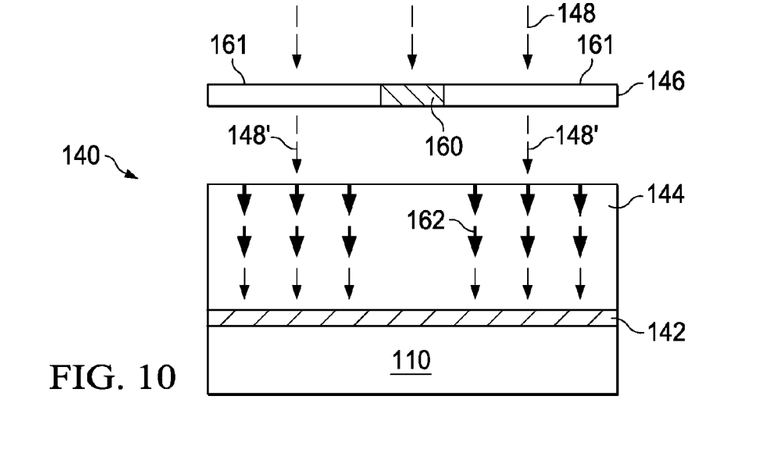
FIGS. 10 through 12 are cross-sectional views of a portion of a semiconductor device at various stages of manufacturing in accordance with some embodiments.
Figure 11:
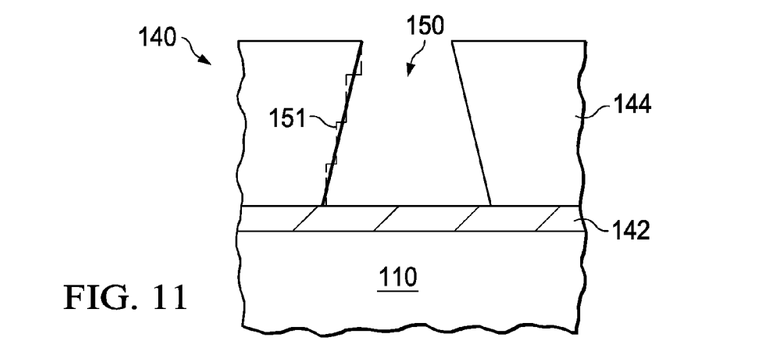
Figure 12:
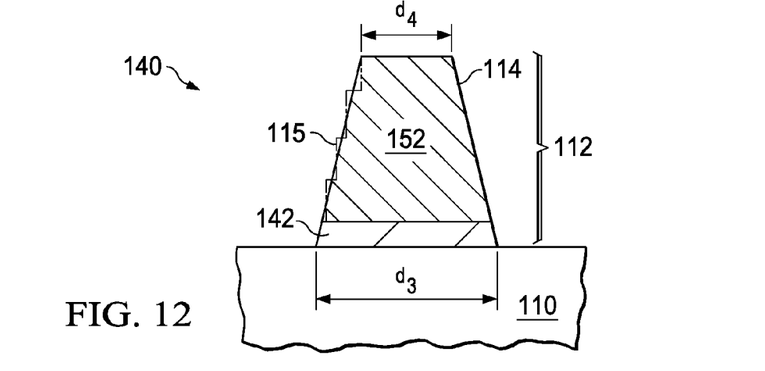

FIGS. 10 through 12 are cross-sectional views of a portion of a semiconductor device 140 at various stages of manufacturing in accordance with some embodiments. FIG. 10 illustrates energy 148 transmitting past blocked regions 160 and through openings 161 of a lithography mask 146. FIG. 10 also illustrates an effect of the exposure energy 148' within the photoresist 144. The layer of photoresist 144 includes an absorption material. In some embodiments, the absorption material comprises one or more dyes that are added to the material of the photoresist 144. The absorption material may comprise a modification of a chemical bond structure of a photo active component (PAC) of the photoresist 144. The absorption material achieves an absorption of a predetermined spectrum for the photoresist 144, for example. The exposure 162 of the photoresist 144 comprises a gradient intensity absorption, exposing more of the photoresist 144 proximate a top portion of the photoresist 144 than proximate a bottom portion of the photoresist 144. When the photoresist 144 is developed, a greater amount of the photoresist 144 is left remaining in the top portion of the photoresist 144 than in the bottom portion, as shown in FIG. 11, forming patterns 150 comprising an anti-ladder shape. The patterns 150 in the photoresist 144 may comprise gradually and evenly tapered sidewalls, or alternatively, the patterns 150 may comprise stair-shaped or ladder shaped sidewalls 151, as shown in phantom. Alternatively, the sidewalls of the patterns 150 may comprise other shapes.

Only one layer of photoresist 144 is shown in the drawings. Alternatively, the novel tapered profile of the conductive traces 112 may be achieved by any suitable technique, such as the use of multiple photoresist layers 144 with different patterning properties and one or more exposures, diffusion techniques, image reversal processes, multiple exposures using different masks, and/or the like, as examples.

FIG. 12 illustrates a conductive trace 112 comprising the tapered sidewalls 114 formed in the pattern 150 of the photoresist 144 shown in FIG. 11. The conductive trace 112 extends in and out of the paper in the view shown by a predetermined amount, such as a few μm to several mm, for example, which is also illustrated in the top view in FIG. 9. In accordance with some embodiments of the present disclosure, each conductive trace 112 includes a bottom region 156 having a width $d_3$ and a top region 158 having a width $d_4$, wherein width $d_4$ is less than width $d_3$. The conductive traces 112 extend lengthwise by an amount (not labeled in the drawings; see the lengthwise extensions of the conductive traces 112 in the top view shown in FIG. 9) that is greater than dimension $d_3$ in some embodiments, for example. The conductive trace 112 may comprise sidewalls 115 comprising a stair-step or ladder shape, as shown in phantom, in some embodiments. Alternatively, the conductive trace 112 sidewalls may comprise other shapes.

Figure 13:
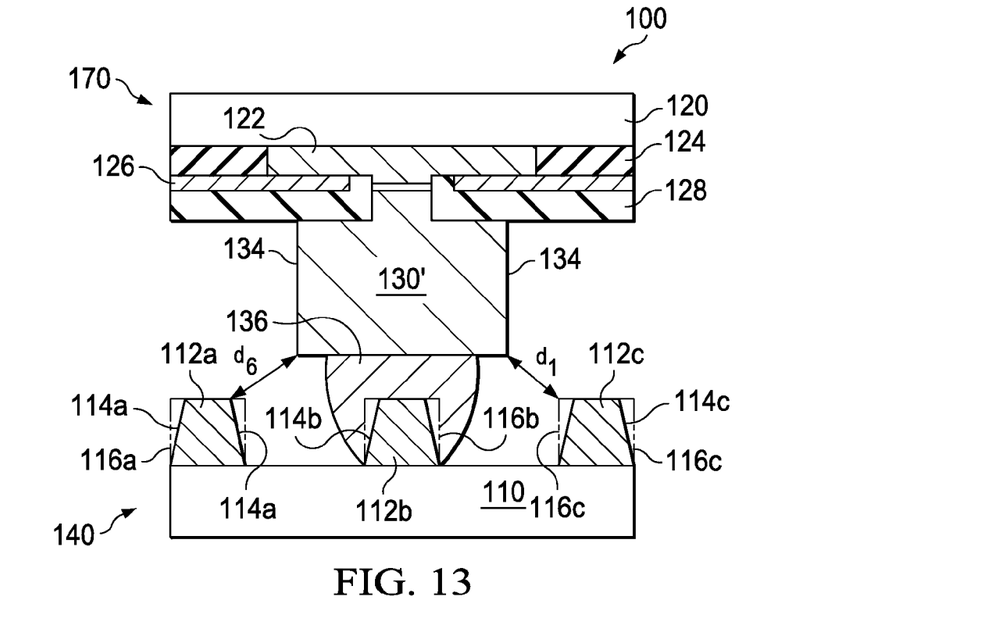
FIG. 13 is a cross-sectional view of a portion of a packaged semiconductor device in accordance with some embodiments of the present disclosure.

FIG. 13 is a cross-sectional view of a portion of a packaged semiconductor device 100 in accordance with some embodiments of the present disclosure. The conductive bumps 130' comprise vertical sidewalls 134 in the embodiments shown. Dimension $d_6$ illustrates a distance between a top corner edge of conductive trace 112a having tapered sidewalls 114a and a bottom corner edge of conductive bump 130' having the vertical sidewalls 134. Dimension $d_6$ is greater than dimension $d_1$, which is the distance between the bottom corner edge of conductive bump 130' and a conventional conductive trace 112c having vertical sidewalls 116c, illustrated in phantom. Dimension $d_6$ comprises dimension $d_1$+about (1.5 μm to 5 μm) in some embodiments, as an example. Dimension $d_6$ comprises about 11.5 μm to 22.5 μm in some embodiments, for example. Alternatively, dimension $d_6$ may comprise other values. Thus, implementing the conductive traces 112a, 112b, and 112c in a packaging system having conductive bumps 130' with vertical sidewalls 134 advantageously decreases the potential of bridging between the solder joint 136 and adjacent conductive traces 112a and 112c.

Figure 14:
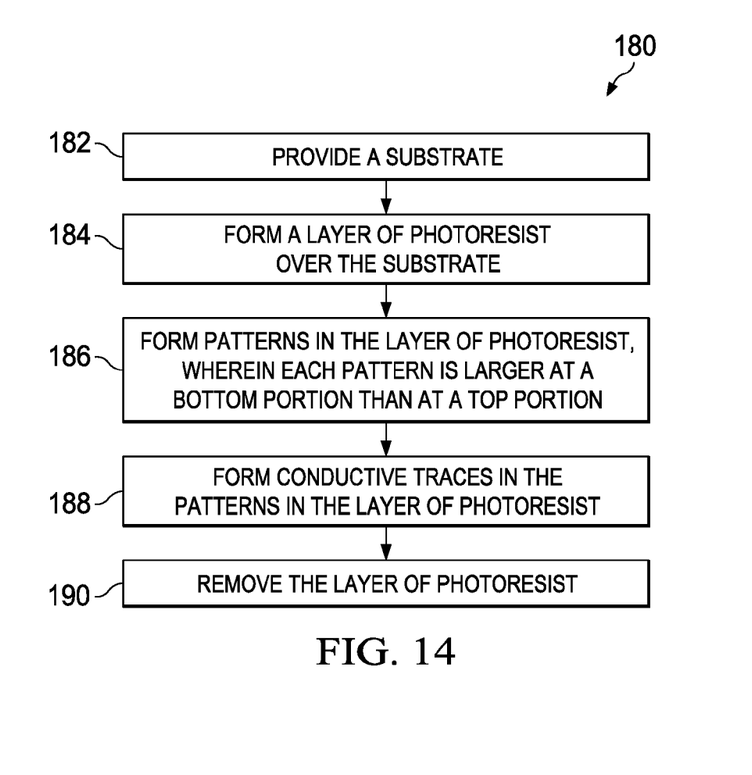
FIG. 14 is a flow chart of method of manufacturing a semiconductor device in accordance with some embodiments.

FIG. 14 is a flow chart 180 illustrating a method of manufacturing a semiconductor device 140 (shown in FIGS. 2 through 7) in accordance with some embodiments. In step 182, a substrate 110 is provided and in step 184, a layer of photoresist 144 is formed over the substrate 110 (shown in FIG. 2). In step 186, patterns 150 are formed in the layer of photoresist 144, wherein each pattern is larger at a bottom portion than at a top portion of the layer of photoresist 144 (shown in FIGS. 3 and 4). In step 188, conductive traces 112 are formed in the patterns 150 in the layer of photoresist 144 (shown in FIG. 5). In step 190, the layer of photoresist 144 is removed (shown in FIG. 6).

Some embodiments of the present disclosure include methods of forming semiconductor devices 140, and also include semiconductor devices 140 manufactured using the methods described herein. Some embodiments of the present disclosure also include packaged semiconductor devices 100 that have been packaged using the novel semiconductor devices 140 and methods of manufacture thereof described herein.

Advantages of some embodiments of the disclosure include providing novel packaged semiconductor devices 100 having an increased distance $d_2$ or $d_6$ between conductive bumps 130 or 130', respectively, and conductive trace 112a (see FIGS. 1 and 13, respectively) corner edges on two semiconductor devices 140 and 170 that are packaged together. The increased and enlarged amount of space between conductive bumps 130 or 130' and adjacent or neighboring conductive traces 112a and 112c reduces or prevents bridging of the solder joint 136 with adjacent conductive traces 112a and 112c, improving yields. A wider bridge window between the solder joint 136 and adjacent conductive traces 112 is provided. Peeling of the conductive traces 112, 112a, 112b, and 112c away from the substrate 110 is also reduced or prevented by the novel structures and methods described herein.

Implementing conductive traces 112 with tapered sidewalls 114 and conductive bumps 130 with tapered sidewalls 132 in a packaging system avoids the need to reduce conductive trace 112 line-widths and/or the need to reduce the conductive bump 130 dimensions proximate the substrates 110 and 120, respectively. Rather, the widths of the tapered tips of the conductive traces 112 and conductive bumps 130 can be reduced while maintaining the dimension or widths of the conductive traces 112 and conductive bumps 130 proximate the substrates 110 and 120. In other embodiments, the conductive traces 112 and conductive bumps 130 or 130' can advantageously be placed closer together to achieve a smaller conductive trace 112 spacing design rule.

More robust design windows for insulating material layer delamination and conductive trace 112 peeling issues are obtainable by implementing the tapered conductive traces 112 described herein. Insulating material layers of the substrates 110 and/or 120 may include low dielectric constant (k) materials having a dielectric constant of about 3.9 or less or extreme low k (ELK) materials having a dielectric constant of about 2.5 or less, which can have delamination issues in some applications, for example.

In some embodiments, the metal oxide 154 (see FIG. 8) included on sidewalls of the conductive bumps 130 and/or 130' provides improved adhesion capability of the conductive bumps 130 or 130' with a subsequently deposited molding compound and/or underfill material 159.

The semiconductor device 100 comprises a BOT flip chip chip scale package (FCCSP) with improved yields in some embodiments. In some embodiments, the conductive traces 112 are ladder-shaped and are bonded to ladder-shaped conductive bumps 130. In other embodiments, the conductive traces 112 are ladder-shaped and are bonded to conductive bumps 130' with substantially vertical sidewalls. The bottom semiconductor device 140 comprises a flip chip BOT package in some embodiments.

The relatively wide base dimension of the bottom region 156 of the novel conductive traces 112 may reduce current density, and the narrower top region 158 of the conductive traces 112 may reduce the probability of misalignment when coupling semiconductor device 140 to another semiconductor device 170 in some embodiments. The novel semiconductor device 140 structures and designs described herein are advantageously easily implementable in manufacturing and packaging process flows.

A ratio of dimension $d_1$ (the distance between a corner edge of an adjacent conductive trace 112c having a conventional vertical sidewall 116c and a corner edge of a conductive bump 130 having a vertical sidewall 134; see FIG. 1) to dimension $d_3$ (the width of the bottom region 156 of a conductive trace 112; see FIG. 8) comprises about 0.7 to 1.0. Advantageously, implementing conductive traces 112 having tapered sidewalls in accordance with embodiments of the present disclosure increases this ratio. For example, a ratio of dimension $d_6$ (the distance between a top corner edge of conductive trace 112a having tapered sidewalls 114a and a bottom corner edge of conductive bump 130' having vertical sidewalls 134; see FIG. 13) to dimension $d_3$ comprises about 0.9 to 1.15 in accordance with some embodiments. Implementing both conductive traces 112 having tapered sidewalls and also conductive bumps 130 having tapered sidewalls 132 in accordance with embodiments of the present disclosure further increases the ratio. For example, a ratio of dimension $d_2$ (the distance between a corner edge of an adjacent conductive trace 112a having a tapered sidewall 114a and a corner edge of a conductive bump 130 having a tapered sidewall 132; see FIG. 1) to dimension $d_3$ comprises about 1.1 to 1.3. The larger the ratio, the less likely it is that bridging will occur between the solder joint 136 and adjacent conductive traces 112a and 112c. The ratio of the corner-to-corner distance between a conductive bump 130 or 130' and an adjacent conductive trace 112, 112a, or 112c to dimension $d_3$ is greater than about 1.0 in accordance with some embodiments, as another example.

In accordance with some embodiments of the present disclosure, a semiconductor device includes a substrate and a plurality of conductive traces disposed over the substrate. Each of the plurality of conductive traces comprises a bottom region proximate the substrate and a top region disposed opposite the bottom region. The top region comprises a first width and the bottom region comprises a second width. The second width is greater than the first width.

In accordance with other embodiments, a method of manufacturing a semiconductor device includes providing a substrate, forming a layer of photoresist over the substrate, and forming a plurality of patterns in the layer of photoresist. Each of the plurality of patterns is larger at a bottom portion proximate the substrate than at a top portion opposite the bottom portion. The method includes forming a plurality of conductive traces in the plurality of patterns in the layer of photoresist, and removing the layer of photoresist.

In accordance with other embodiments, a packaged semiconductor device includes a first substrate including a plurality of conductive bumps disposed thereon, and a second substrate including a plurality of conductive traces disposed thereon. Each of the plurality of conductive traces includes a bottom region proximate the second substrate, a top region opposite the bottom region, and tapered sidewalls. The top region comprises a first width, and the bottom region comprises a second width. The second width is greater than the first width. Each of the plurality of conductive bumps is coupled to a top surface of one of the plurality of conductive traces by a solder joint.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
a first substrate;
a plurality of conductive traces disposed over the first substrate, wherein each of the plurality of conductive traces comprises a bottom region proximate the first substrate and a top region opposite the bottom region, wherein the top region comprises a first width, wherein the bottom region comprises a second width, wherein the second width is greater than the first width, and wherein each of the plurality of conductive traces extends laterally over the first substrate over a distance greater than the second width;
a second substrate having a plurality of conductive bumps protruding from a surface of the second substrate facing the first substrate, the plurality of conductive bumps substantially aligned with the plurality of conductive traces, each of the plurality of conductive bumps having tapered sidewalls and a lowest surface extending away from the second substrate, wherein the lowest surface is spaced apart from the first substrate and the plurality of conductive traces;
a metal-containing oxide layer disposed over the tapered sidewalls of each of the plurality of conductive bumps;
a solder joint extending from the lowest surface of each of the plurality of conductive bumps to the first substrate, wherein the solder joint covers sidewalls of each of the plurality of conductive traces, and wherein no solder joint is disposed over the tapered sidewalls of each of the plurality of conductive bumps; and
a molding material between the first substrate and the second substrate.

2. The semiconductor device according to claim 1, wherein each of the plurality of conductive traces comprises tapered sidewalls, and wherein an angle of the tapered sidewalls with respect to a top surface of the first substrate comprises about 75° to 89°.

3. The semiconductor device according to claim 1, wherein the plurality of conductive traces comprise a material selected from the group consisting essentially of copper, aluminum, tungsten, nickel, palladium, gold, and combinations thereof.

4. The semiconductor device according to claim 1, wherein the semiconductor device comprises an integrated circuit die, an interposer, a packaging device, a printed circuit board (PCB), a high-density interconnect, an organic substrate, a ceramic substrate, or a bump-on-trace (BOT) package.

5. The semiconductor device according to claim 1, wherein a ratio between the first width and the second width ranges between about 0.75 and about 0.97.

6. A packaged semiconductor device, comprising:
a first substrate including a plurality of conductive bumps disposed thereon;
a second substrate including a plurality of conductive traces disposed thereon, wherein each of the plurality of conductive traces includes a bottom region proximate the second substrate, a top region opposite the bottom region, and a first plurality of tapered sidewalls, wherein each of the plurality of conductive bumps is aligned with and spaced apart from a respective one of the plurality of conductive traces, wherein each of the plurality of conductive bumps is coupled to a top surface of a first portion of one of the plurality of conductive traces by a solder joint, wherein a second portion of the one of the plurality of conductive traces extends outside a lateral extent of the plurality of conductive bumps, wherein each of the plurality of conductive bumps comprises a second plurality of tapered sidewalls including a first sidewall and a second sidewall opposing the first sidewall, wherein a distance between the first sidewall and the second sidewall decreases continuously along a direction from the first substrate to the second substrate, wherein the second plurality of tapered sidewalls of each of the plurality of conductive bumps include a metal-containing oxide formed thereon, wherein the solder joint extends from an upper surface of each of the plurality of conductive bumps distal the first substrate to the second substrate, and wherein the second plurality of tapered sidewalls of each of the plurality of conductive bumps is free of the solder joint; and
a molding layer filling a gap between the first substrate and the second substrate.

7. The packaged semiconductor device according to claim 6, wherein a ratio of a distance between a corner edge of one of the plurality of conductive bumps to a corner edge of an adjacent one of the plurality of conductive traces to a width of the bottom region of one of the plurality of conductive traces is greater than about 1.0.

8. The packaged semiconductor device according to claim 6, wherein each of the plurality of conductive bumps comprises a shape selected from the group consisting essentially of a octagon, hexagon, capsule, barrel, trapezoid, diamond, dumbbell, ladder, and combinations thereof.

9. The packaged semiconductor device according to claim 6, wherein each of the plurality of conductive bumps comprises a material stack selected from the group consisting essentially of Cu pillar/solder, Cu pillar/Ni/solder, Cu pillar/Au/solder, Cu pillar/Pd/solder, Cu pillar/Ti/solder, and combinations thereof.

10. The packaged semiconductor device according to claim 9, wherein each of the plurality of conductive bumps includes solder, and wherein the solder comprises a material selected from the group consisting essentially of tin, silver, lead-free tin, copper, and combinations thereof.

11. The packaged semiconductor device according to claim 6, wherein each of the plurality of conductive bumps does not include solder.

12. The packaged semiconductor device according to claim 6, wherein the first plurality of tapered sidewalls of each of the plurality of conductive traces are stair-shaped.

13. The packaged semiconductor device according to claim 12, wherein an angle between the second substrate and the first plurality of tapered sidewalls of each of the plurality of conductive traces is between about 75° and about 89°.

14. The packaged semiconductor device according to claim 6, wherein the top region of each of the plurality of conductive traces comprises a first width, wherein the bottom region of each of the plurality of conductive traces comprises a second width, wherein the first width is about 0.75 to about 0.97 times the second width.

15. A semiconductor device, comprising:
   a first substrate having a plurality of conductive pads disposed on a first side of the first substrate, and a plurality of conductive bumps with a first height disposed on respective ones of the plurality of conductive pads, wherein the plurality of conductive bumps have tapered sidewalls with a metal-containing oxide layer disposed thereon;
   a second substrate having a plurality of traces with a second height disposed thereon, the plurality of traces having tapered sidewalls, wherein the first height of the plurality of conductive bumps and the second height of the plurality of traces are measured along a direction from the first substrate to the second substrate, and a sum of the first height and the second height is smaller than a distance between the first substrate and the second substrate;
   a plurality of solder joints coupling the plurality of conductive bumps and the plurality of traces to each other, wherein each of the plurality of solder joints extends from an upper surface of a respective one of the plurality of conductive bumps distal the first substrate to the second substrate, and no portion of the plurality of solder joints is disposed over the tapered sidewalls of the plurality of conductive bumps; and
   a molding compound or underfill material filling a gap between the first substrate and the second substrate.

16. The semiconductor device according to claim 15, wherein each of the plurality of conductive bumps has two tapered sidewalls opposing each other with a distance therebetween, the distance continuously decreasing along a direction from the first substrate to the second substrate.

17. The semiconductor device according to claim 15, wherein a respective one of the plurality of traces is disposed within a width of a respective one of the plurality of conductive bumps.

18. The semiconductor device according to claim 15, wherein each of the tapered sidewalls of the plurality of traces comprises a plurality of steps.

19. The semiconductor device according to claim 15, wherein a distance between two opposing tapered sidewalls of each of the plurality of traces has a minimum value and a maximum value, wherein a ratio of the minimum value to the maximum value is in a range between about 0.75 and about 0.97.

20. The semiconductor device according to claim 15, wherein a composition of the plurality of conductive bumps is free of solder.

* * * * *